United States Patent [19]
McBain

[11] 3,970,540
[45] July 20, 1976

[54] CLAMPING DEVICE FOR USE IN ELECTROPLATING

[75] Inventor: William Lander McBain, Oakville, Conn.

[73] Assignee: The Mitchell-Bate Company, Waterbury, Conn.

[22] Filed: Mar. 26, 1975

[21] Appl. No.: 562,147

[52] U.S. Cl. .......................... 204/297 W; 204/297 R
[51] Int. Cl.² ............................................ C25D 17/04
[58] Field of Search ..................... 204/297 R, 297 W

[56] References Cited
UNITED STATES PATENTS

| | | | |
|---|---|---|---|
| 537,011 | 4/1895 | Burton et al. | 204/297 W |
| 2,258,391 | 10/1941 | Novitsky | 204/297 W |
| 2,505,212 | 4/1950 | Schneider | 204/297 W |

OTHER PUBLICATIONS

Western Electric Tech., Dig. No. 25, pp. 59, 60 by Milo, Jan., 1972.

*Primary Examiner*—F.C. Edmundson

[57] ABSTRACT

A clamping device for use in an electroplating process is provided having a support with at least one object-engaging portion. At least one element is resiliently attached to the support with each element having an object-engaging portion facing a corresponding object-engaging portion on the support. The element object-engaging portion is resiliently biased toward its corresponding support object-engaging portion. A manually engageable means is attached to each element for separating the element object-engaging portion from its corresponding support object-engaging portion. When more than one element is used, each is individually movable by the manually engageable means. The corresponding object-engaging portions have object-engaging surfaces which are, respectively, in parallel planes. The corresponding object-engaging portions are skewed relative to one another. The support and elements are made of an electrically conductive material but are completely covered, except for the object-engaging surfaces, by an electrically nonconductive material.

12 Claims, 4 Drawing Figures

CLAMPING DEVICE FOR USE IN ELECTROPLATING

The present invention relates to a clamping device for use in gripping an object undergoing an electroplating operation.

An object to be plated is conventionally attached to a rack by a clamping device. The rack is inserted into a plating bath where the plating material is deposited on the object. The word "plating" is used herein in a broad sense to include any process wherein one material is deposited onto another, such as anodizing. The clamping device is an essential component in the successful completion of the plating process. It must therefore meet the following requirements: (1) hold the object securely during the severe agitation often encountered in the plating baths, (2) grip and release the object easily and quickly, (3) provide a good electrical contact, (4) be made of an electrically conductive material, (5) be covered by an electrically non-conductive and acid-resistant material, (6) leave minimum of rack marks on the plated object, and (7) be durable. The electrical requirements (3–5) are necessary for electroplating operations where current is transmitted through the clamping device. In such an operation, plating material is deposited on the clamping device as well as on the object, eventually resulting in deterioration of its performance, unless it is covered by an electrically insulating material. The acid resistance of the insulating material is necessary because the device is periodically dipped in an acid solution to strip from its exposed parts any deposited plating material.

Clamping devices in conventional usage are variations of a basic device utilizing a U-shaped member through one leg of which a thumbscrew is inserted. With a rigid member, the object is gripped between one leg and the screw. With a resilient member, the screw passes through a hole in one leg and into a threaded hole in another leg, and the object is gripped between the legs as one leg is forced toward the other by the screw. These screw-type clamping devices are subject to two serious problems. First, at least a section of the threaded portion of the screw cannot be covered with the non-conductive material, because that would interfere with its proper operation. Since the screw is made of an electrically conductive material, plating material is deposited on this exposed section during the plating operation. This deposited material makes it increasingly more difficult for the operator to turn the thumbscrew in gripping and releasing the object. Thus, either electrical contact and the secure grip on the object are compromised, or the operator must resort to use of pliers to turn the screw. The use of such pliers wears away the non-conductive material, and sometimes even results in breakage of the thumbscrew. As for the second problem, turning of the thumbscrew results in the sliding of one surface of non-conductive material covering a portion of the screw over another surface of such material covering one leg of the member. This hastens the deterioration of the non-conductive material which decreases the operating life of the clamping device. In addition to both of the above problems, the operator must not exceed a relatively small margin of error in tightening the screw. On the one hand, if the object is not gripped securely, it will be loosened by the agitation in the plating bath, and the plating material may not be applied properly. On the other hand, if the object is gripped too tightly, damage may occur, especially if it is something as relatively fragile as a printed circuit board, for example. The fact that the operator must exercise care in not exceeding this margin in gripping each object adds considerably to the production time and labor costs involved, because every thumbscrew turns with a different amount of difficulty depending on how heavily plated it is.

It is, therefore, the primary object of the present invention to provide a clamping device for gripping an object quickly and securely.

Another object of the present invention is to provide a clamping device for establishing good electrical contact with the object.

Still another object of the present invention is to provide an electrically conductive clamping device that is completely covered by an electrically non-conductive material except for the object-engaging surfaces.

A further object of the present invention is to provide a clamping device that is durable and relatively inexpensive to produce.

In accordance with these objects, a clamping device is provided having a support and at least one element resiliently attached to the support. Corresponding object-engaging portions on each of the support and element, respectively, face each other and are adapted to engage the object therebetween. The corresponding object-engaging portions are normally biased toward each other, and a means is attached to each of the at least one element to individually move each element so as to separate the corresponding object-engaging portions. The resilient attachment allows a quick gripping and release of the object to be plated and facilitates coverage of the entire clamping device except for those surfaces of the object-engaging portions actually contacting the object. More than one element is preferably attached to the support so that each device can grip more than one object. This results in lower cost of the device since fewer separate parts are required as well as providing a more efficient utilization of the space within the plating bath. In a preferred embodiment, the object-contacting surfaces are elongated and lie in substantially parallel, horizontal planes as well as being in relatively skewed vertical planes to each other. This configuration provides a firm grip of the object even if the object-engaging portions are imprecisely formed.

To the accomplishment of the above and to such other objects as may hereinafter appear, the present invention relates to the construction of a clamping device, as defined in the appended claims and as described in the specification, taken together with the accompanying drawings, in which:

In order to eliminate the defects of the clamping devices in conventional usage, it is imperative to eliminate the necessity for a screw in gripping the object. Thus, another tightening means must be used which can be completely covered by the insulation and which provides a quick, easy and uniform grip and release action. The structure of the device must involve no rubbing of insulation surfaces, require parts which are relatively inexpensively produced, and be easily adaptable to provide efficient utilization of the space within the plating bath.

To these ends, the present invention provides a relatively simple and inexpensive apparatus which is broadly comprised of elements A and B resiliently attached to a support C by a resilient means D. Each element has an object-engaging portion at one end facing an object-engaging portion on the support, and a manually engageable portion at its other end to be used for moving the element with respect to the support. Resilient means D biases each element object-engaging portion toward its corresponding support object-engaging portion. Application of manual force by the operator to the manually engageable portion on each element deforms resilient means D to separate the corresponding object-engaging portions.

Figure 1:
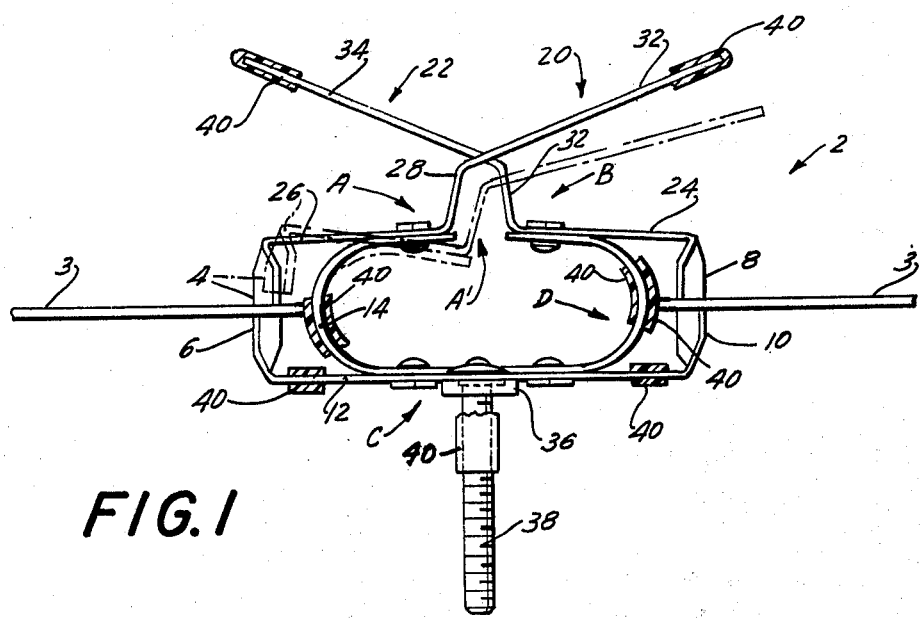
FIG. 1 is a front elevational view of the present invention.

Turning to a more specific description of the present invention, the device 2 is shown in FIG. 1 as having a means at each end to grip an object 3, such as a printed circuit board 3. At one end of device 2, part 4 of element A faces part 6 attached to support C, while at the other end of device 2, part 8 of element B faces part 10 attached to support C. The portion of support C to which parts 6 and 10 are attached is a strip 12 carrying the parts 6 and 10 at each end. Elements A and B are resiliently attached to support C by resilient means D which is comprised of a strip 14 bent into an arc at each end, with each arc extending between strip 12 and each of the elements. Strip 14 is securely fixed to strip 12 and to elements A and B to provide a strong, solid device 2 with the only movement possible being due to deformation of strip 14. The unbiased shape of strip 14 has an arc wider than that shown in FIG. 1. However, the engagement of parts 4, 6 and 8, 10, respectively, prevents it from attaining this shape. As a result, the engaging parts are biased toward each other by strip 14 and can only be separated by its deformation. Such deformation is attained by forcing element A, for example, toward strip 12 to further compress the arc of strip 14. As strip 14 deforms, the end of the strips move more than the rest of the arc and thus, it acts to lift part 4 from part 6, as shown by A'.

In order to enable the ready deformation of strip 14 to separate the engaged parts when inserting or removing the object, each element includes a manually engageable portion extending away from the point of attachment between it and strip 14. This manually engageable portion provides a lever-type action to reduce the force required to deform strip 14. Without the provision of such a lever-type action, separation of the engaging parts would be difficult, because strip 14 must be relatively stiff in order to provide the secure gripping action required during the plating process, as discussed above. Manually engageable portion 20 is a part of element A while manually engaging portion 22 is a part of element B. Each of portions 20 and 22 is designed (1) to provide a given amount of travel to separate the corresponding object-engaging portions by a given amount, (2) to provide a convenient surface for the operator to press against when deforming strip 14, and (3) to be movable without interference from the other manually engaging portion. The given amount of travel is provided by angling the portion away from the other element proper. Thus, portion 20 of element A is angled away from portion 24 of element B while portion 22 of element B is angled away from portion 26 of element A. Using element A as an example, its portion 20 can move the entire distance between its normal position and portion 24 of element B in order to separate part 4 from part 6. This difference is preset to provide a given separation between parts 4 and 6 to accommodate the particular object to be plated. Such variation of the distance is obtained by the chosen angle between portion 20 of element A and portion 24 of element B. The bent, upwardly extending section 28 of portion 20 also contributes to this freedom of movement. The further section 28 extends upward from portion 26, the greater the distance manually engageable portion 20 can travel before it abuts against portion 24 of element B.

Figure 2:
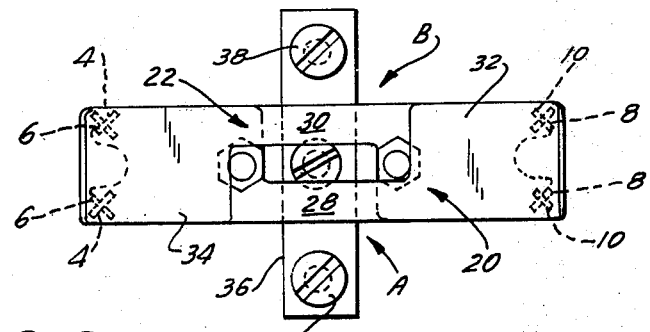
FIG. 2 is a top plan view of the present invention.

Since portions 20 and 22 cross each other, as seen in FIG. 1, they must be separated to enable their individual movement. In order to provide this separation while maintaining the compactness of the device, each of portions 20 and 22 is recessed at the appropriate location. As best seen in FIG. 2, section 28 of element A fits within a recess in portion 22 of element B, and section 30 of element B fits within a recess in portion 20 of element A. As a result, portions 28 and 30 are spaced from each other even though elements A and B overlap. Consequently, portion 20 can be moved without its engaging or abutting against anything until it reaches portion 24 of element B.

To provide a convenient surface for the operator to press against in deforming strip 14, the entire width of element A is used at the extremity of manually engageable portion 20 to provide a handy tab-like portion. This tab is wide enough so that is will not cut into the operator's hand when he is exerting the force required to deform the strip 14. Tab 32 is a part of element A while tab 34 is a part of element B.

Figure 4:
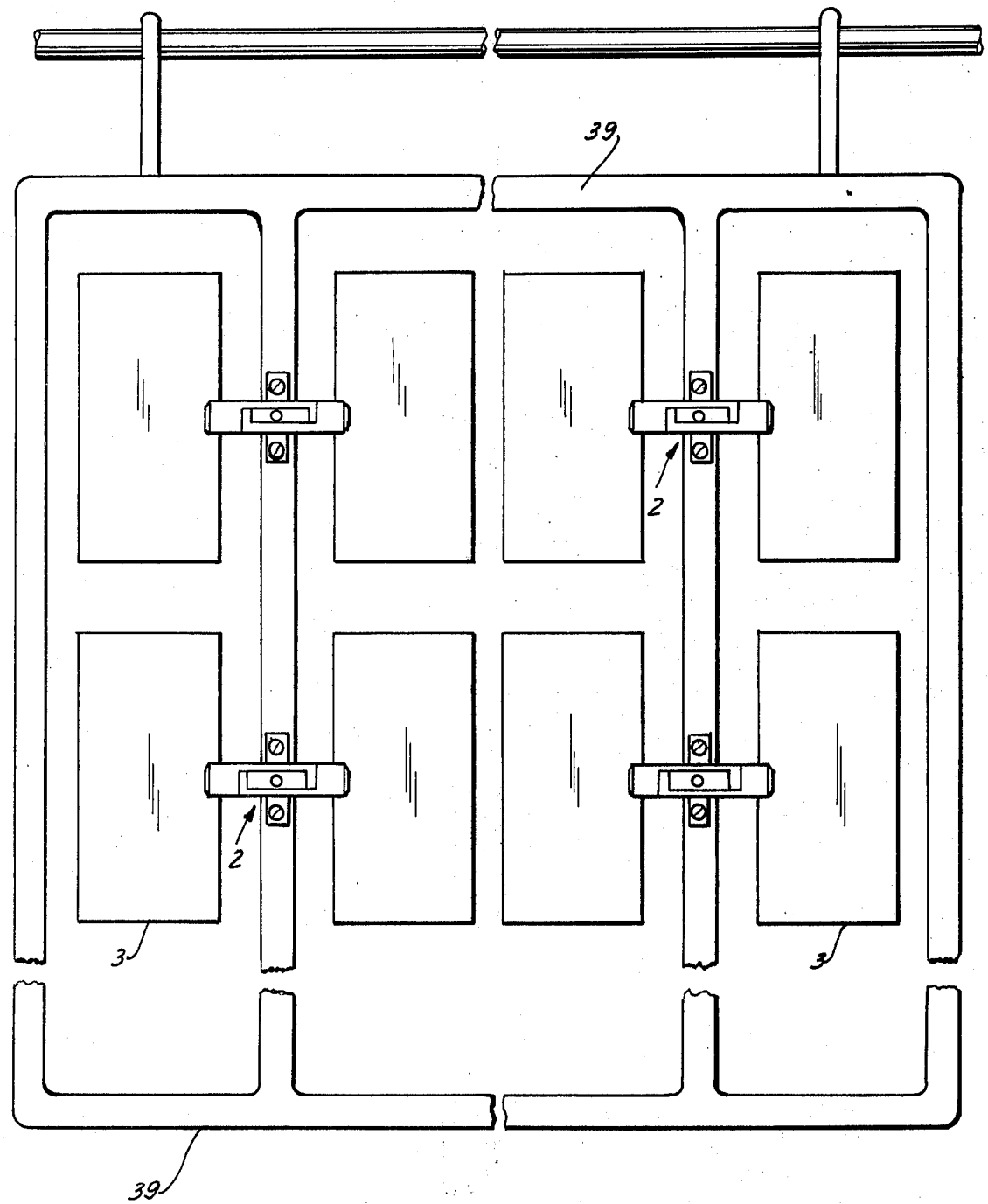
FIG. 4 is a top plan view of a rack and various articles secured to the rack by the clamping devices of the present invention.

Bar 36 is a part of element C and is fixed to the underside of strip 12 and extends laterally thereof. A screw 38 is fixed at each end of bar 36. Screws 38 are used to attach device 2 to a conventional rack 39 as shown in FIG. 4.

Parts A, B, C and D are securely attached to each other to provide a strong, solid structure. Screws are shown as an exemplary attachment means but others, such as welding, can be used as well. In the preferred embodiment, the screws are spot-welded to prevent them from loosening due to vibration.

Operation of the device is quick and easy. Device 2 is attached to rack 39 by screws 38, and it remains so attached for a predetermined number of plating cycles. To insert an object between the engaging parts, the operator moves element A to the A' position by depressing tab 32 to deform strip 14 and separate part 4 from part 6. The object 3 is then inserted between parts 4 and 6 until its leading edge touches strip 14. As the operator releases tab 32, part 4 is forced back toward part 6 by strip 14 to firmly grip the object.

Although engageable parts 4, 6, 8, and 10 can be made in a variety of shapes and types, our preferred embodiment utilizes the ends of the strips from which parts A, B, and C are made. This reduces the number of parts needed, increases reliability, and reduces cost. Using parts 4 and 6 as an example, part 6 is bent at approximately 90° to strip 12 while part 4 is bent at approximately 90° to portion 26 of element A. In this configuration, parts 4 and 6 are positioned to engage along the narrow surface defined by the thickness of strips 12 and 26, respectively. In order for such parts to engage solidly, device 2 would have to be made with precision. Otherwise, parts 4 and 6 would not fully engage or might not even engage at all. Such precision manufacture of the device would, of course, add to its cost and, since all mechanical parts wear in time, this alignment might vary with usage and thus would decrease the operating life of the device. I have found that these disadvantages can be overcome by imparting a twist to parts 4 and 6 relative to each other so that they are in skewed vertical planes relative to each other. Consequently, parts 4 and 6 do not engage along their entire surface but rather at a point along the length of each. As a result, if either of the parts is not bent to precisely 90°, the point of engagement will merely slide along the length of the other part. A firm mechanical grip and a good electrical contact are still achieved. Thus, the twisting operation, which can be done relatively easily and cheaply, provides a secure, reliable contact for the lifetime of the device and with little manufacturing precision being required.

Figure 3:
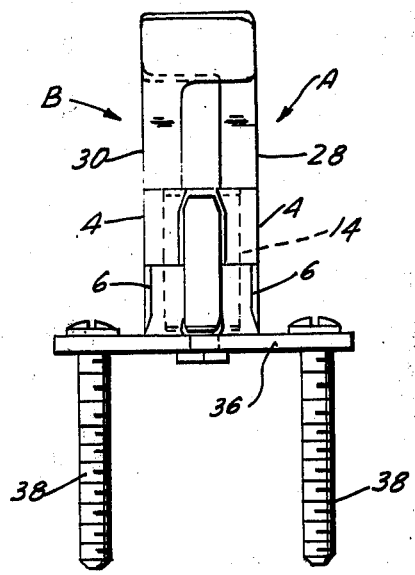
FIG. 3 is a side elevational view of the present invention as viewed from the left side of FIG. 1.

To prevent movement of the object during the plating process and to provide a greater number of electrical contacts to handle the high current densities involved in today's plating processes, two engageable parts are provided at the object-engaging ends of elements A and B to correspond with two engageable parts attached to each end of strip 12. This is best shown in FIG. 3. A more positive and more reliable gripping of the object is thereby provided while the unplated marks left on the object due to these gripping parts are relatively small.

As mentioned above, device 2 must be able to conduct current during the plating process. Consequently, it must be made of an electrically conductive material such as copper, aluminum, titanium phosphor bronze, brass, or plain steel. The preferred material, however, is stainless steel for its durability and its resistance to the acid used in the stripping process.

When device 2 has been completely assembled, it is coated with an electrically non-conductive material 40. This insulating material covers all of the device 2 except for the engaging surfaces of parts 4, 6, 8, and 10. The preferred material is a bonded polyvinyl chloride known as plastisol. No metal surface is left uncovered during the plating process, in contast to the screw-type of device, because the engaging surfaces are in contact with the object, and the rest of the device is fully covered. Consequently, practically no plating material is deposited on the device 2 during the plating process to interfere with normal operation of the device.

It will be apparent from the foregoing that the advantages of the present invention are achieved by providing a resilient gripping action for the clamping device with a configuration which allows insertion and removal of the object without producing a sliding action between adjacent surfaces of the device, thereby increasing its operating life. The resilient gripping action allows a fast, dependable and uniform clamping action which requires no adjustments by the operator. The parts are relatively inexpensive to produce and the necessity for precision in the manufacture to obtain a good gripping action and electrical contact is decreased with the twist given to the object-engaging portions. The device is protected from the plating material as well as the acid used in the stripping operation by an electrically non-conductive material which covers all portions of the device except for those which cannot be covered because they are designed to come in contact with the object. The device is easily adaptable to vary the gripping force by varying the stiffness of the resilient means and by altering the length of the manually engageable portions of the elements. Also, the device can be easily designed to accommodate various sized objects. A further advantage of the present invention is the fact that overcompression of the resilient means is prevented by the inability on the part of the operator to depress the tabs beyond a certain distance which is well within the elastic limit of strip 14.

While but a single embodiment of the present invention has been here specifically disclosed, it will be apparent that many variations may be made therein, particularly in the shape of the resilient means and the manually engageable portions, all within the scope of the instant invention as defined in the following claims.

What is claimed is:

1. A clamping device for gripping an object, comprising:
   a. a support;
   b. two elements on said support each having an object-engaging portion comprising a section having an elongated edge surface, said respective edge surfaces facing and at least partially registering with each other in substantially parallel horizontal planes and being in relatively skewed vertical planes;
   c. resilient means operatively connected to said elements for biasing said object-engaging portions toward and into engagement with each other; and
   d. means operatively connected to at least one of said elements for deforming said resilient means to separate said object-engaging portions.

2. The device of claim 1, wherein said vertical planes are substantially perpendicular to each other.

3. The device of claim 1, wherein said elements and said support are electrically conductive, and further comprising an electrically insulating material covering the entire clamping device except for said edge surfaces.

4. The device of claim 1 wherein said edge surfaces are substantially planar.

5. A clamping device for gripping a plurality of objects, comprising;
   a. a support having a plurality of spaced object-engaging portions attached thereto equal to the number of objects to be gripped, each of said support object-engaging portions including an elongated edge surface;
   b. a like plurality of elements on said support spaced from one another, each of said elements having an object-engaging portion facing one of said support object-engaging portions and including an elongated edge surface, corresponding support and element edge surfaces facing and at least partially registering with each other in substantially parallel horizontal planes and being in relatively skewed vertical planes;
   c. resilient means operatively connected to said support and each of said elements, respectively, for biasing each of said element object-engaging portions toward and into engagement with its corresponding support object-engaging portion; and
   d. individual means operatively connected, respectively, to each of said elements for deforming said resilient means to individually separate each element object-engaging portion from its corresponding support object-engaging portion.

6. The device of claim 5, wherein said deforming means is comprised of an extension of each of said elements, the extension of one element extending over the other element proper, each element extension including a recess accommodating the recessed portion of the other element extension.

7. The device of claim 6, wherein the said elements are substantially identical.

8. The device of claim 5, wherein said resilient means is comprised of a resilient strip bent at both ends and operably connected at its central portion to said support, each of said bent ends being operably connected to a different one of said elements and in its biased state being substantially parallel to said central portion.

9. The device of claim 8, wherein the corresponding vertical planes are substantially perpendicular to each other.

10. The device of claim 5, wherein said elements, said support object-engaging portions, and said support are electrically conductive, and further comprising an electrically insulating material covering the entire clamping device except for said edge surfaces.

11. The device of claim 5, wherein the corresponding vertical planes are substantially perpendicular to each other.

12. The device of claim 5 wherein said edge surfaces are substantially planar.

* * * * *